(12) United States Patent
Clavette (10) Patent No.: US 11,817,786 B2
(45) Date of Patent: *Nov. 14, 2023

(54) EMBEDDED SUBSTRATE VOLTAGE CONVERTER MODULE

(71) Applicant: Infineon Technologies AG, Neubiberg (DE)

(72) Inventor: Danny Clavette, Greene, RI (US)

(73) Assignee: Infineon Technologies AG, Neubiberg (DE)

( * ) Notice: Subject to any disclaimer, the term of this patent is extended or adjusted under 35 U.S.C. 154(b) by 77 days.

This patent is subject to a terminal disclaimer.

(21) Appl. No.: 17/508,078

(22) Filed: Oct. 22, 2021

(65) Prior Publication Data

US 2022/0045612 A1 Feb. 10, 2022

Related U.S. Application Data

(63) Continuation of application No. 16/655,295, filed on Oct. 17, 2019, now Pat. No. 11,183,934.

(51) Int. Cl.
*H01L 27/02* (2006.01)
*H01L 27/06* (2006.01)
*H02M 3/158* (2006.01)

(52) U.S. Cl.
CPC ...... *H02M 3/1582* (2013.01); *H01L 27/0203* (2013.01); *H01L 27/0629* (2013.01); *H01L 27/0676* (2013.01)

(58) Field of Classification Search
CPC .. H02M 3/1582; H02M 3/158; H02M 3/1584; H01L 27/0203; H01L 27/0629;
(Continued)

(56) References Cited

U.S. PATENT DOCUMENTS 10,128,035 B2 11/2018 Yao et al.
10,367,415 B1 7/2019 Sturcken et al.
(Continued)

FOREIGN PATENT DOCUMENTS

EP 3007223 4/2016

*Primary Examiner* — Duy T Nguyen
(74) *Attorney, Agent, or Firm* — Murphy, Bilak & Homiller, PLLC (57) ABSTRACT

Voltage converter inlay modules are provided for embedding within a package substrate, and are configured to supply power to a processor, or similar digital circuit, which is mounted to the package substrate. The package substrate is typically mounted to a circuit board, or similar. The circuit board provides high-voltage, low-current power to the voltage converter module which, in turn, provides low-voltage high-current power to the processor. The voltage converter inlay provides largely vertical current conduction from the circuit board to the processor, thereby reducing conduction losses incurred by lateral current conduction. The location of the voltage converter inlay between the circuit board and the microprocessor minimizes radiation of electromagnetic interference. The number of terminals allocated for providing power to the package substrate may be minimized due to the voltage converter inlay inputting fairly low levels of current. The high-current power required by the processor is constrained within the package substrate.

20 Claims, 7 Drawing Sheets

(58) Field of Classification Search
CPC ..... H01L 27/0676; H01L 27/088; G06F 1/26; H05K 1/185
USPC ........................................................ 257/561
See application file for complete search history.

(56) References Cited

U.S. PATENT DOCUMENTS

| | | |
|---|---|---|
| 10,609,844 B1 | 3/2020 | Wu et al. |
| 2003/0128017 A1 | 7/2003 | Kumar et al. |
| 2004/0188811 A1 | 9/2004 | Vandentop et al. |
| 2005/0207133 A1 | 9/2005 | Pavier et al. |
| 2007/0013080 A1 | 1/2007 | Dibene et al. |
| 2007/0249092 A1 | 10/2007 | Joshi et al. |
| 2007/0279882 A1 | 12/2007 | Weir et al. |
| 2010/0188184 A1 | 7/2010 | Chen |
| 2011/0042795 A1 | 2/2011 | Knickerbocker |
| 2011/0234196 A1 | 9/2011 | Chiba |
| 2013/0075932 A1 | 3/2013 | Schwarzer et al. |
| 2014/0367828 A1 | 12/2014 | Colonna et al. |
| 2015/0049533 A1 | 2/2015 | Nishikimi et al. |
| 2015/0171065 A1 | 6/2015 | Guzek et al. |
| 2015/0311145 A1* | 10/2015 | Cho .................. H01L 23/49524 438/122 |
| 2015/0380061 A1 | 12/2015 | Matsumoto et al. |
| 2016/0050768 A1 | 2/2016 | Chen et al. |
| 2016/0128197 A1 | 5/2016 | Standing et al. |
| 2016/0233192 A1 | 8/2016 | Dosluoglu |
| 2016/0349288 A1 | 12/2016 | Barnette et al. |
| 2016/0351478 A1* | 12/2016 | Lai ....................... H01L 29/7395 |
| 2016/0365304 A1* | 12/2016 | Cho .................. H01L 23/49575 |
| 2016/0381823 A1 | 12/2016 | Ye et al. |
| 2017/0237339 A1 | 8/2017 | Young et al. |
| 2017/0302151 A1 | 10/2017 | Snook et al. |
| 2017/0338171 A1* | 11/2017 | Cho .................. H01L 23/49534 |
| 2018/0190635 A1 | 7/2018 | Choi et al. |
| 2018/0211899 A1 | 7/2018 | Morianz et al. |
| 2019/0273073 A1 | 9/2019 | Murtuza et al. |
| 2020/0035396 A1 | 1/2020 | Weis |
| 2020/0075541 A1* | 3/2020 | Sturcken ............... H01L 23/645 |
| 2020/0113059 A1 | 4/2020 | Xiong et al. |

\* cited by examiner

EMBEDDED SUBSTRATE VOLTAGE CONVERTER MODULE

TECHNICAL FIELD

The present application relates to a voltage regulator that is embedded within a substrate and that provides vertical current flow for powering a microprocessor or similar.

BACKGROUND

Digitally-intensive integrated circuits (ICs), including central processing units (CPUs), graphics processing units (GPUs), and application-specific integrated circuits (ASICs), continue to reduce silicon feature sizes so as to increase speed, reduce circuit size, and/or increase performance. Such smaller silicon feature sizes require lower supply voltages due to the lower breakdown voltages that are inherently associated with the reduced feature sizes. As the required voltage decreases, current supply levels need to increase to maintain similar power consumption and processor performance. These higher current levels, in turn, typically require additional terminals for powering an IC, e.g., a CPU. The additional power terminals result in larger IC substrate packaging and sockets, which adds cost and reduces density.

The higher currents described above lead to higher conduction losses between a power supply, e.g., a voltage regulator, and a CPU or similar IC. These conduction losses may be constrained by minimizing the length, and associated resistance, of circuit-board traces supplying power to the CPU or a similar load. In a typical implementation, the voltage regulator(s) may be located on a circuit board and near to the load (e.g., CPU), so as to minimize the conduction losses.

Some recent implementations have attempted to further reduce the conduction loss by integrating a voltage regulator into the same die as the digital IC, e.g., a CPU. While such implementations provide low conduction losses, these implementations have not gained much traction due to high cost, high risk, and other problems. In particular, silicon processes optimized for digital circuitry are often not amenable for implementing high-power transistors, as needed by voltage regulators. Hence, a voltage regulator integrated in a predominantly-digital silicon die may suffer in performance (including power efficiency of the switches), have interference issues with the digital portion of the die, reduce overall yields for the die, etc.

Circuits and devices are needed that reduce conduction loss between a power supply and an associated load, while not requiring integration of the power supply and load within the same silicon die.

SUMMARY

According to an embodiment of a switching voltage converter module, the module is configured to conduct current in a vertical direction. The module comprises a substrate, an input terminal, an output terminal, one or more power switches, and an inductor. The substrate has first and second main surfaces that are opposite each other. The input terminal is located at the first main surface and is configured for connection to a power source. The output terminal is located at the second main surface and is configured for connection to a power sink (load). The one or more power switches and the inductor are embedded in the substrate between the first and second main surfaces, and the inductor is coupled to the one or more power switches. The inductor may be a single (non-coupled) inductor or a coupled inductor.

According to an embodiment of a processor system, the processor system comprises a processor substrate, a processor attached to the processor substrate, and a switching voltage converter module arranged within the processor substrate. The switching voltage converter module includes a converter substrate, a converter input terminal, a converter output terminal, one or more power switches, and an inductor. The converter substrate has first and second main surfaces that are opposite each other. The converter input terminal is located at the first main surface and is configured for connection to a power source. The converter output terminal is located at the second main surface and is connected to an input power terminal of the processor substrate. The one or more power switches and the inductor are embedded in the converter substrate between the first and second main surfaces, and the inductor is coupled to the one or more power switches.

According to an embodiment of a circuit board system, the system comprises a circuit board having a first surface, a power source, and a processor system. The processor system includes a processor substrate that is electrically connected to the first surface, a processor attached to the processor substrate, and a switching voltage converter module arranged within the processor substrate. The switching voltage converter module comprises a converter substrate, a converter input terminal, a converter output terminal, one or more power switches, and an inductor. The converter substrate has first and second main surfaces that are opposite each other. The converter input terminal is located at the first main surface and is configured for connection to the power source via a power terminal of the circuit board. The converter output terminal is located at the second main surface and is connected to an input power terminal of the processor substrate. The one or more power switches and the inductor are embedded in the converter substrate between the first and second main surfaces, and the inductor is coupled to the one or more power switches.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

Locating a voltage converter beside a microprocessor, or a similar digitally-intensive integrated circuit (IC), on a circuit board potentially incurs significant conduction loss due to lateral current conduction through the circuit board. Integrating a voltage converter within the same silicon die as the microprocessor presents problems that make this an intractable solution for many applications. In particular, any defect within the voltage converter portion of the die may render the integrated microprocessor/voltage converter unusable, thereby decreasing yields for the relatively expensive microprocessors. It is generally preferable to have the voltage converter as a separate module that can be tested and trimmed, such that known good voltage converters are available for subsequent pairing with (relatively-expensive) microprocessor dies, or similar digital devices.

One option is to integrate a voltage converter and microprocessor on the same package substrate (but not within the same silicon die), which is then mounted to a circuit board. Such an option provides advantages in that high-voltage power having a relatively low current is supplied to the package substrate. Due to the low current, fewer pins are required on the package substrate to supply the power, as compared with a non-integrated voltage converter. High-current (low-voltage) power is constrained to the package substrate. In a version of such an implementation, power switches and associated drivers of the voltage converter may be integrated within the package substrate. The inductor and capacitors of the voltage converter, which is typically a buck converter, are mounted on top of the substrate, e.g., beside the microprocessor. While such an implementation provides modularization advantages relative to integrating the microprocessor and voltage converter in the same silicon die, and provides power loss improvements relative to a non-integrated solution, this solution has several drawbacks. First, locating the inductor and capacitors beside the microprocessor requires that there is still a moderate lateral conduction path for the high current, which results in undesirable power loss and reduced efficiency. Second, locating the inductor on top of the substrate means that the switching node of the buck converter, or similar, is external to the substrate, thereby generating undesirable electromagnetic interference within the system.

Embodiments described herein address these problems, and reduce power loss and interference while maintaining modularity of the voltage converter. This is accomplished, in part, by embedding the inductor(s) of the voltage converter within a voltage converter inlay that may be placed in a package substrate. The voltage converter may include a single inductor, or may include a coupled inductor that supports, e.g., a two-phase buck converter. Furthermore, the voltage converter may include multiple single inductors or multiple coupled inductors. By embedding the inductor or inductors within the voltage converter inlay, the switching node, e.g., the node connecting a high-side power transistor to a low-side power transistor and to an inductor, is not routed to an external surface of the package substrate. The high-frequency noise associated with the switching node may, thus, be better suppressed. Additionally, in some embodiments, input and output capacitors of the voltage converter may be integrated within the inlay rather than being mounted on the package substrate. Such embodiments further reduce lateral current flow and associated power loss. The voltage converter inlay may be placed within a cavity of the package substrate, and may provide shielding such that minimal high-frequency interference radiates from the inlay or the package substrate.

The invention is described below using several examples, which should not be considered limiting. Embodiments of a switching voltage converter module, or inlay, are described, as are processor systems and circuit board systems that incorporate switching voltage converter modules. In an exemplary processor system, a microprocessor die is attached to a package substrate, wherein the package substrate provides connections between the microprocessor and a circuit board. The package substrate includes a cavity between the microprocessor die and the circuit board, wherein a switching voltage converter module may be situated. The switching voltage converter module is configured to vertically supply current from the circuit board to the microprocessor. A high-voltage, low-current power may be provided from the circuit board to the switching voltage converter module. The switching voltage converter module, in typical implementations, steps down the provided voltage so as to supply low-voltage, high-current power to the microprocessor. Current flows vertically through the switching voltage converter module, from an input terminal located on a first surface that is facing the circuit board to an output terminal located on a second surface that is facing the microprocessor.

For ease of explanation, the inventions are described below using examples that include a microprocessor or central processing unit (CPU). It should be understood that similar systems may instead or additionally include a graphics processing unit (GPU), an application-specific integrated circuit (ASIC), artificial intelligence (AI) accelerators, or other primarily digital circuits, and that the voltage converter modules described herein may be used within such similar systems.

Figure 1:
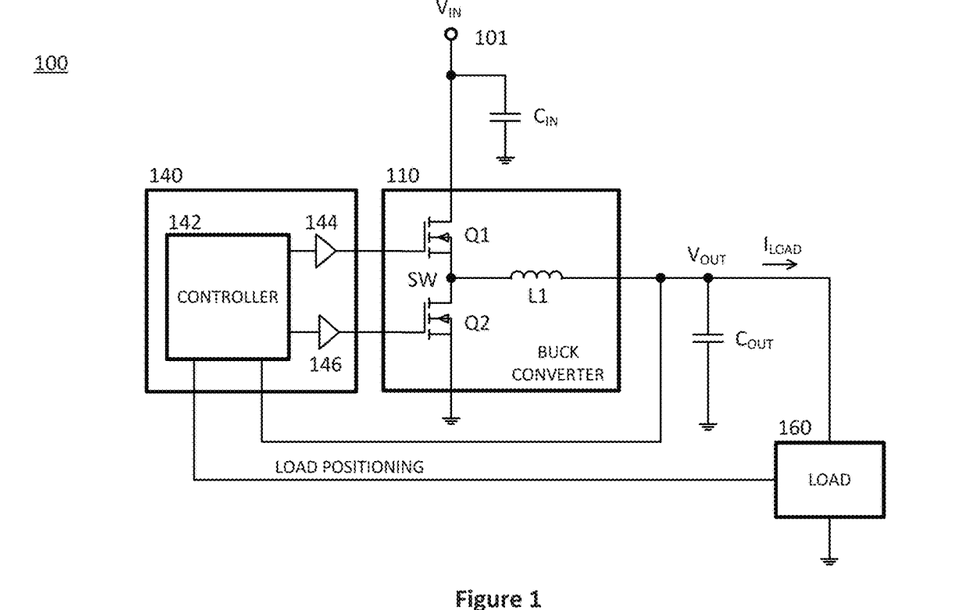
FIG. 1 illustrates a schematic diagram of a voltage converter module and associated circuitry.
Figure 2:
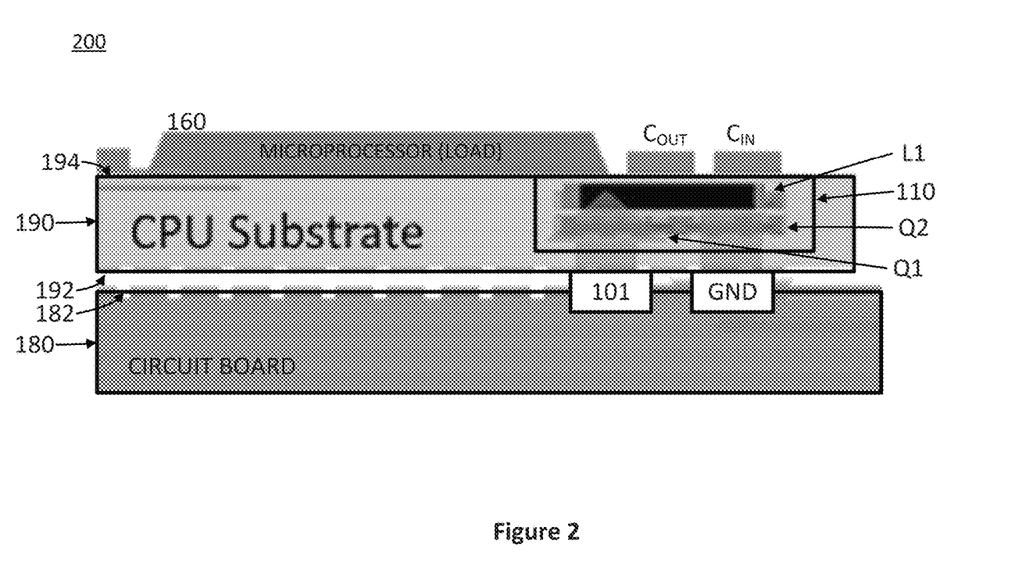
FIG. 2 illustrates the voltage converter module of FIG. 1 within a package substrate, together with a circuit board and microprocessor that are attached to the package substrate.

FIGS. 1 and 2 illustrate a system that includes a voltage converter module 110 for powering a load 160, such as a microprocessor or a similar power sink. FIG. 1 illustrates a circuit schematic 100 for such a system, whereas FIG. 2 illustrates a physical arrangement of the components within such a system 200.

The circuit 100 of FIG. 1 includes a voltage converter module 110, a load 160, and controller/driver circuitry 140. The voltage converter module 110 is supplied with an input voltage $V_{IN}$ via an input terminal 101. An input capacitor $C_{IN}$ filters the input voltage $V_{IN}$. As illustrated, the voltage converter module 110 is a buck converter that includes a high-side switch Q1, a low-side switch Q2, and an inductor L1. The high-side switch Q1 is coupled between the input terminal 101 and a switching node SW, whereas the low-side switch Q2 is coupled between the switching node SW and ground. The illustrated switches Q1, Q2 are n-channel MOSFETs, but it should be understood that other switch types may be used, e.g., p-channel MOSFETs, JFETS, insulated-gate bipolar transistors (IGBTs), bipolar junction transistors (BJTs), and high-electron mobility transistors (HEMTs). Regardless of switch type, the power switches Q1, Q2 may be provided on separate dies, or may be monolithically integrated in the same semiconductor die. An energy-storage inductor L1 couples the switching node SW to an output $V_{OUT}$ and an associated filter capacitor $C_{OUT}$. The output voltage $V_{OUT}$ powers the load 160, e.g., a microprocessor, via a load current $I_{LOAD}$.

A controller 142 generates switch control signals for the switches Q1, Q2, so as to maintain the output voltage $V_{OUT}$ at a desired (e.g., target) value. The switch control signals are provided to the switches Q1, Q2 via drivers 144, 146. The output voltage $V_{OUT}$ is fed back to the controller 142, so that the controller 142 may implement closed-loop control. For example, the controller 142 may include a proportional-integral-derivative (PID) controller. Because control techniques, including closed and open loop control, and transistor drivers are well-known in the art, they will not be described further herein.

The controller 142 and the load 160 may coordinate the supply of power. For example, the load 160 may inform the controller 142, e.g., via the illustrated "load positioning" signal, that the load 160 is changing to a different power mode, e.g., a sleep mode or a high power-consumption mode. Rather than reacting to a changed load, the controller 142 may predictively adjust its power output according to the load positioning signal. For example, the load 160 may provide an adaptive voltage positioning (AVP) signal to the controller 142, so that the controller 142 increases supplied power in anticipation of increased processor load. The co-location of the controller 142 and the load 160 in/on the same package substrate makes such predictive load positioning more feasible. When the load 160 is a microprocessor and the voltage converter controller is integrated within the microprocessor, as described in relation to FIG. 4B, such predictive load positioning becomes even more easily implemented.

FIG. 2 illustrates a cross-sectional view of a circuit board system 200 that includes an arrangement of the components of the circuit 100. The system 200 includes a circuit board 180 and a package substrate 190. The circuit board 180 has a first surface 182, onto which the package substrate 190 is mounted. A power source (not shown for ease of illustration) provides power to the circuit board 180 which, in turn, provides input power to the package substrate 190 via terminal (or terminals) 101 and one or more ground terminals that are located on a first surface 192 of the package substrate 190.

A load 160 is attached at a second surface 194 of the package substrate 190. The load 160 is a microprocessor die as illustrated, but it should be understood that the microprocessor could be replaced with other processing circuits including, e.g., a GPU, an ASIC, an AI accelerator, or a digital signal processor (DSP). The load 160 has a plurality of signal terminals and one or more power terminals, which are coupled to corresponding terminals on the package substrate 190. (For ease of illustration, these terminals are not shown.)

The package substrate 190 has additional terminals on its first surface 192, for electrically connecting to the circuit board 180. These terminals may be, e.g., balls of a ball grid array (BGA) or through-hole pins. The terminals may be directly attached, e.g., soldered, to the circuit board 180, e.g., using through holes or BGA pads on the circuit board 180. Alternatively, a socket (not shown for ease of illustration) may be used to connect the package substrate 190 to the circuit board 180, i.e., the socket may be soldered to the circuit board 180 and the package substrate 190 may be plugged into the socket. Use of a socket enables easy replacement of the microprocessor 160, and related components attached to the package substrate 190. This may be beneficial if the microprocessor 160, or related, is found to be faulty after mounting to the circuit board 180, or if it is desired to upgrade the microprocessor 160 at a future date after initial population of the circuit board 180. Inclusion of a voltage converter, e.g., the buck converter 110, enables power to be transferred to the socket using a high voltage and low current. The low current reduces the power loss through pins of the socket and reduces the number of required socket pins, thereby making use of a socket more viable.

The buck converter 110 is embedded within the package substrate 190. In particular, the high-side switch Q1, the low-side switch Q2, and the inductor L1 are embedded in a cavity between the first and second surfaces 192, 194 of the package substrate 190. An input terminal 101 is connected to the high-side switch Q1, whereas a ground terminal (GND) is connected to the low-side switch Q2. The input terminal (or terminals) 101 and the ground terminal (or terminals) GND are located at the first surface 192 of the package substrate 190. Input and output capacitors $C_{IN}$, $C_{OUT}$ are mounted on the second surface 194 of the package substrate 190.

The voltage converter controller/driver circuitry 140 may be included within the package substrate 190, so that the controller 142 may readily communicate with the load 160 for load positioning and so that the drivers 144, 146 are located reasonably close to the switches Q1, Q2. While not explicitly shown in the package substrate 190, the voltage converter controller/driver circuitry 140 may be located in front of or behind the buck converter 110, and is out of view in the cross-sectional view of FIG. 2. Alternatively, the voltage controller/driver circuitry 140 may be located to the side of the buck converter 110, e.g., below the illustrated microprocessor die 160. In another alternative, the drivers 144, 146 may be monolithically integrated in the same semiconductor dies, respectively, as the switches Q1, Q2, such that the driver 144 is be integrated in the same die as the high-side switch Q1, and the driver 146 is be monolithically integrated in the same die as the low-side switch Q2. In another alternative, the drivers 144, 146 may be integrated in the same semiconductor die while the power switches Q1, Q2 are integrated in another semiconductor die. In yet another alternative, the drivers 144, 146 and the power switches Q1, Q2 may be monolithically integrated in the same die.

Figure 3A:
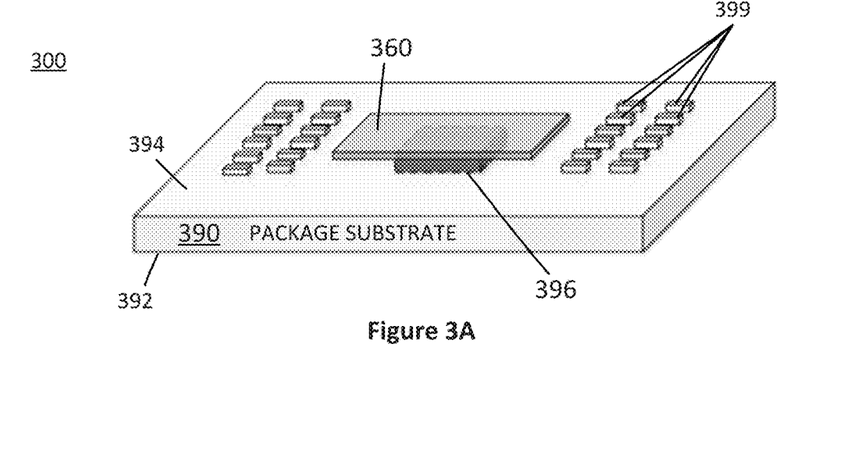
FIGS. 3A, 3B, and 3C illustrate different views of a processor system that comprises a package substrate, a processor attached to the package substrate, and a switching voltage converter module embedded within the package substrate.
Figure 3B:
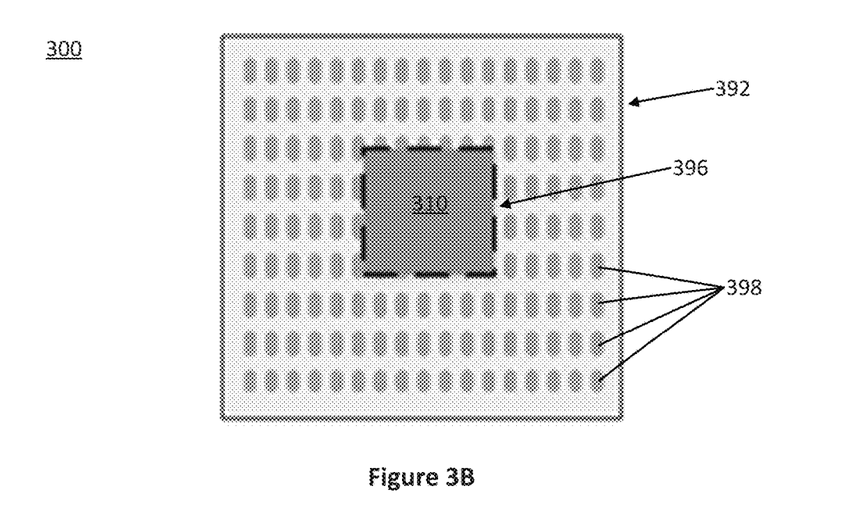
Figure 3C:
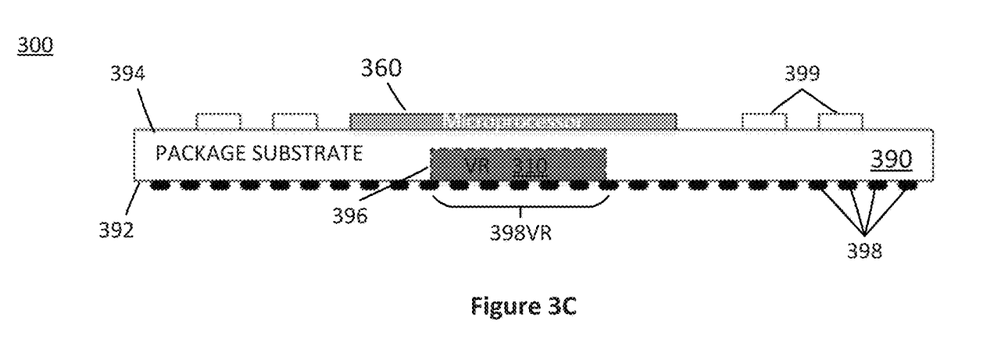

FIGS. 3A, 3B, and 3C illustrate three views of a processor system 300 including a microprocessor die (load) 360, a package substrate 390, and a voltage converter module 310. FIG. 3A provides a pictorial view, which shows the top and sides of the processor system 300. FIG. 3B provides a plan view of a first main surface 392 of the processor system 300. FIG. 3C provides a cross-sectional view of the processor system 300.

As shown in FIG. 3A, the package substrate 390 has a first main surface 392, also termed a bottom surface, which is configured for mounting to a circuit board, a socket, or similar. A second main surface 394, also termed a top surface, is on an opposing side of the package substrate 390. The microprocessor 360, e.g., a silicon die comprising digital circuitry, is mounted to the top surface 394, e.g., using a ball grid array or similar terminals for transfer of digital signals, power, etc. A plurality of discrete components 399, e.g., pull-up resistors, pull-down resistors, decoupling capacitors, is also mounted on the top surface 394 of the package substrate.

FIG. 3B illustrates a plan view of the bottom surface 392 of the package substrate 390. The package substrate 390 has a cavity 396 located near its center. This cavity 396 extends from the bottom surface 392 into the body of the package substrate 390. A voltage converter module 310 is mounted within the cavity 396. As illustrated, a plurality of terminals 398, e.g., balls of a BGA or pins, surround the cavity 396.

Figure 5A:
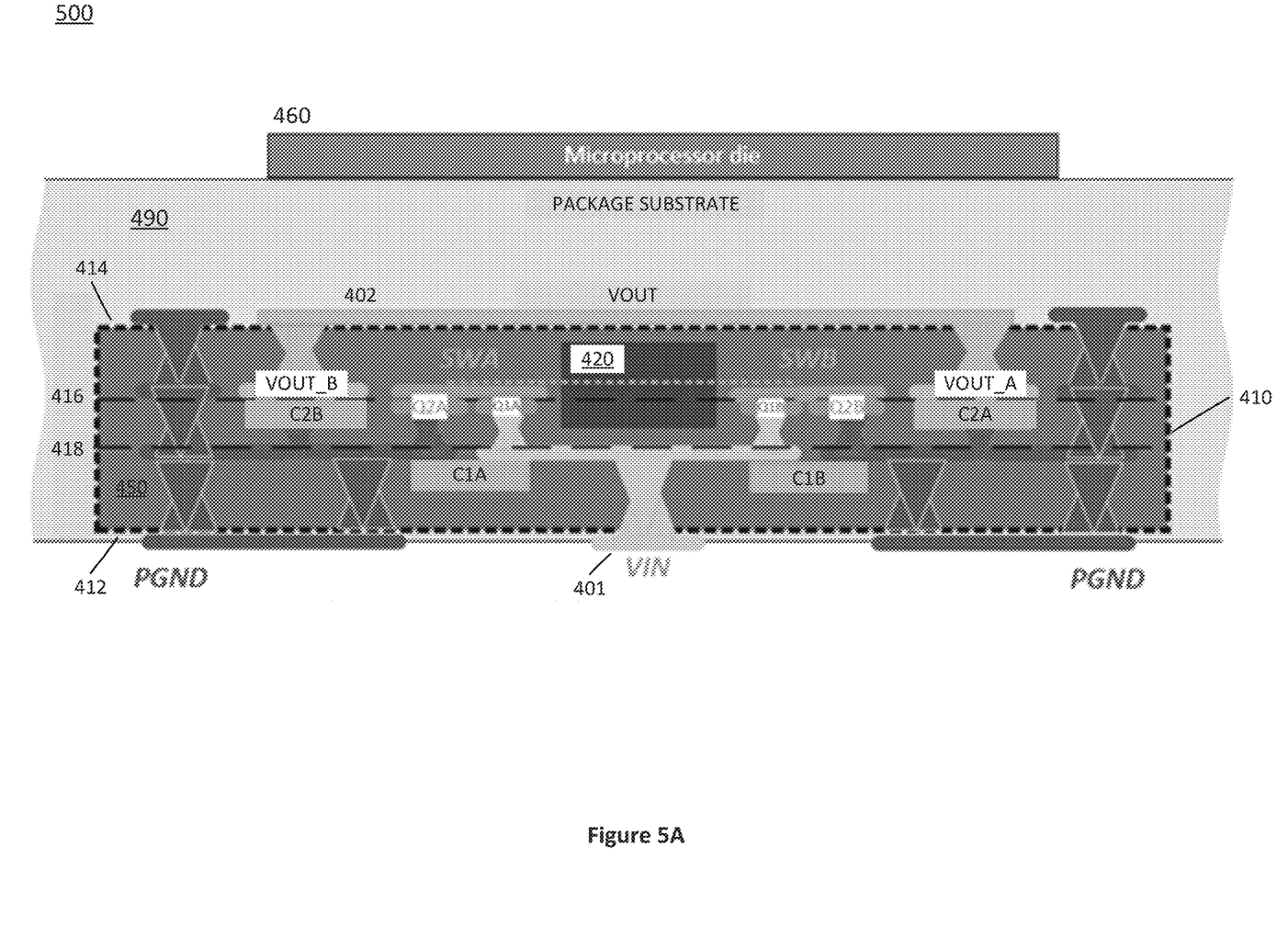
FIGS. 5A, 5B, 5C, 5D, and 5E illustrate different views of the voltage converter module of FIGS. 4A and 4B within a package substrate.

FIG. 3C illustrates a cross-sectional view of the processor system 300, including the components described above. It can be seen that the terminals 398 extend from the bottom surface 392 of the package substrate 390, and are configured for electrical connection to a circuit board (not shown for ease of illustration). In addition to the terminals 398 of the package substrate 390, the voltage converter module 310 has one or more terminals 398VR, e.g., for inputting power to the voltage converter module 310 from a power source (not shown for ease of illustration) via a circuit board (also not shown for ease of illustration). This arrangement of the voltage converter terminals 398VR allows for localized higher voltages in the center portion of the other, e.g., digital signal, terminals 398. For example, digital signals transferred through the terminals 398 may have relatively low currents at low voltages of 1V, whereas the power pins 398VR may include power pins for transferring, e.g., 3V at much higher currents than that of the digital signals. By constraining the power terminals 398VR to the center portion of the substrate surface 392, the power terminals 398VR may be prevented from interfering with the digital signals. Furthermore, and as shown in FIG. 5A, the power terminals 398VR preferably include ground terminals on the periphery and terminals for an input power supply, e.g., $V_{IN}$, on the center terminals, such that the signal terminals 398 are physically separated and somewhat shielded from noise that may be present on terminals of the input power supply.

FIGS. 4A-4B and 5A-5E illustrate circuit schematics and a physical arrangement for a processor system such at that shown in FIGS. 3A-3C, but with particular emphasis on the voltage converter module portion of such a processor system. The voltage converter module portion of FIGS. 4A and 5A-5E may be incorporated into the processor system 300 of FIGS. 3A-3C as the voltage converter inlay (VR) 310.

Figure 4A:
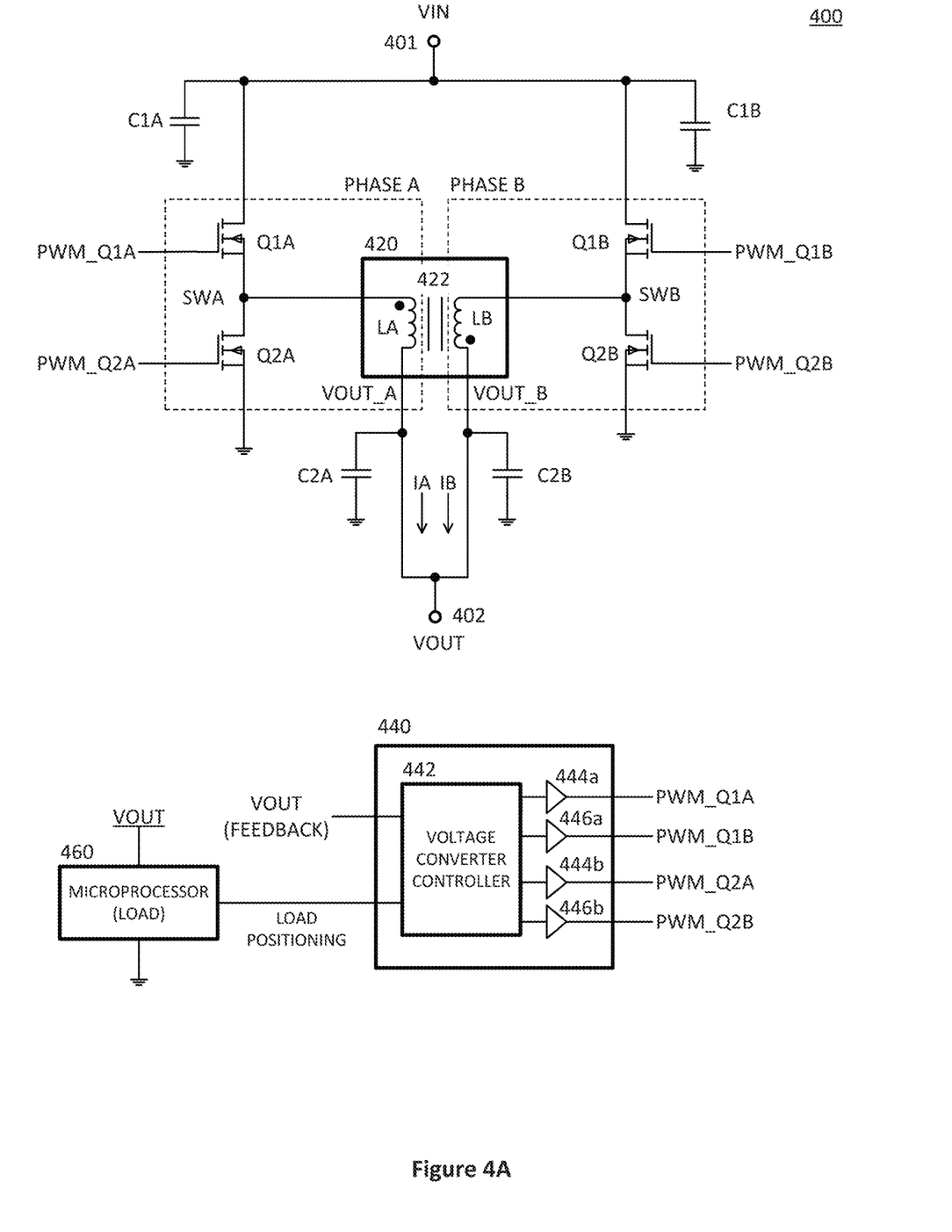
FIGS. 4A and 4B illustrate schematic diagrams for a two-phase voltage converter module that includes a coupled inductor.

FIG. 4A illustrates a circuit schematic 400 for a voltage converter module that includes a coupled inductor 420. The circuit 400 includes two phases of a buck converter. (This may equivalently be considered as two single-phase buck converters.) Each of these phases is configured in much the same manner as the buck converter 110 of FIG. 1. In particular, phase A includes a first switch Q1A (phase A high-side switch), a second switch Q2A (phase A low-side switch), and a first winding LA. The first and second switches are connected at a phase A switching node SWA. Phase B includes a third switch Q1B (phase B high-side switch), a fourth switch Q2B (phase B low-side switch), and a second winding LB. The third and fourth switches are connected at a phase B switching node SWB.

An input terminal 401 provides an input voltage VIN for supplying power to both phase A and phase B. Input capacitors C1A, C1B filter the input voltage VIN, and are preferably physically located near, respectively, the high-sides switches Q1A, Q1B. An output terminal 402 provides an output voltage VOUT for supplying power to a load, such as a microprocessor. The output terminal 402 is provided with a current IA from the first winding LA and a current IB from the second winding LB. Output capacitors C2A, C2B filter the output voltage VOUT, and are preferably physically located near the output terminal 402.

The windings LA, LB are parts of a coupled inductor 420, and are wound around a common core 422 in an opposing configuration. Use of a coupled inductor reduces the volume of the ferrite, or similar, core material, as compared to two non-coupled inductors, as the direct current (DC) portion of the magnetic fields from the two sides cancel each other, thereby providing high system density. The reduced size of the coupled inductor makes its inclusion within a voltage converter inlay of a package substrate more feasible, as described in further detail below.

A voltage converter controller 442 generates control signals for driving the switches Q1A, Q2A, Q1B, Q2B via drivers 444a, 446a, 444b, 446b. These signals are generated, e.g., using closed-loop control wherein the output voltage VOUT is regulated to a desired target voltage. The output voltage VOUT is input to the voltage converter controller 442, so that it may be sensed by a closed-loop controller. The phase A and phase B signals are preferably generated offset in phase, e.g., by 180° such that the currents IA, IB have phase offsets and the overall load current provided at the output terminal 402 has minimal ripple. Because closed-loop control and voltage regulation are well-known in the art, further detail on these topics is not provided.

The output terminal 402 is electrically coupled to the microprocessor 460 and supplies the output voltage VOUT thereto. The microprocessor 460 may have several modes of operation, each having different power requirements. The microprocessor 460 may provide the voltage converter controller 442 with a "load positioning" signal, which provides an indication of upcoming power needs. For example, a microprocessor coming out of sleep mode may inform the voltage converter controller 442 of its impending state, so that the voltage converter controller may ramp up supplied current in preparation for the high-power state, rather than reacting to the higher current draw and incurring a voltage droop in the interim. The voltage converter controller/driver circuitry 440 may be located within the package substrate, and, if so, is preferably within the same voltage converter inlay as the two-phase buck converter. This minimizes trace lengths and noise associated with the, typically pulse-width-modulated (PWM), switch control signals PWM_Q1A, PWM_Q1B, PWM_Q2A, PWM_Q2B, and provides a fast path for exchanging the load positioning signals between the microprocessor 460 and the voltage converter controller 442.

Figure 4B:
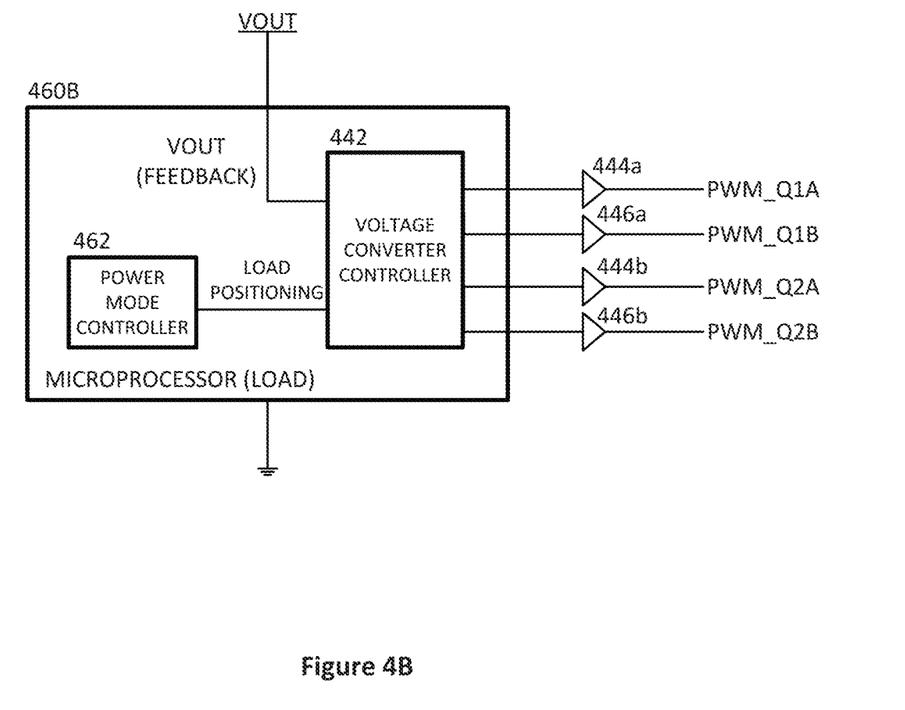

FIG. 4B illustrates a variation of the controller portion of the circuit 400 of FIG. 4A. In this variation, the voltage converter controller 442 is implemented within the microprocessor 460B, such that the microprocessor 460B generates switch control signals for the switches Q1A, Q2A, Q1B, Q2B. For example, a closed-loop control technique may generate the switch control signals based upon a sensed output voltage VOUT, and/or a feedforward control technique may use a load positioning signal generated by a power mode controller 462 within the microprocessor 460B. Such a partitioning provides advantages regarding the speed with which the voltage converter can be adapted to a new power mode, which may be preferred in some applications. The drivers 444a, 446a, 444b, 446b may also be integrated within the microprocessor die 460B, but, more typically, are preferred to be implemented within the voltage converter module/inlay, as the digital silicon die 460B may not be amenable to implementation of the relatively high-current analog transistor drivers 444a, 446a, 444b, 446b.

FIG. 5A illustrates a cross-sectional view of a processor system 500 that includes a voltage converter module 410 including a coupled inductor 420, as described in the circuit 400 of FIG. 4. The cross-sectional view, and the subsequent views of FIGS. 5B-5E, show detailed physical arrangements for the power-flow-related components of the two-phase buck converter of FIG. 4. For ease of illustration, the voltage converter controller/driver circuitry 440 of FIG. 4 is not shown, but it should be understood that these circuits may be located within the voltage converter module 500 of FIG. 5, e.g., in an unshown view, or that the voltage converter controller 442 may be integrated within the microprocessor die.

The processor system 500 includes a microprocessor die 460, a package substrate 490, and a voltage converter module 410, which may be termed an inlay. The current flow through the voltage converter module 410 is largely vertical, i.e., along the thickness direction of the voltage converter module 410 between the top and bottom main surfaces 412, 414, and unnecessary lateral current flow runs are minimized. In particular, note that the switches (transistors) Q1A, Q2A, Q1B, Q2B are vertical power transistors, such as vertical power MOSFETs. (Other switch types, including JFETS, IGBTs, BJTs, and HEMTs may be preferred in some applications). As illustrated, the switches Q1A, Q2A, Q1B, Q2B are in separate dies, but in other embodiments, some or all of the switches may be monolithically integrated in the same semiconductor die. Non-vertical power transistors, e.g., transistors providing largely lateral current flow in which the transistor load terminals are located on the same surface of the transistor, may also be used and may be more feasible when high and low-side power switches are monolithically integrated in the same die.

The switching nodes, e.g., SWA, SWB, are constrained within the voltage converter inlay 410, which is located in a cavity of the package substrate 490 such that the switching nodes SWA, SWB are largely shielded by the metallization of the output terminal 402 and the ground (PGND), together with the microprocessor die 460. Hence, the system provides the advantage of reduced electromagnetic interference (EMI), as compared with other solutions including that of FIG. 2, in which switching nodes are brought external to a voltage converter inlay and a package substrate.

The high-side MOSFETs (switches) Q1A, Q1B have drains that face downwards towards the input terminal 401, located at a first main surface (bottom) 412 of the voltage converter inlay 410, and which supplies the input voltage VIN. Current flows vertically through these MOSFETs Q1A, Q1B to respective sources. The sources of the high-side MOSFETs Q1A, Q1B are coupled, respectively, to drains of the low-side MOSFETs Q2A, Q2B at the switching nodes SWA, SWB. The sources of the low-side MOSFETs Q2A, Q2B are coupled to ground metallizations, which are connected through to power ground terminals (PGND) at the bottom surface 412, as shown.

The phase A input capacitor C1A is preferably located near the phase A high and low-side MOSFETs Q1A, Q2A, whereas the phase B input capacitor C1 B is preferably located near the phase B high and low-side MOSFETs Q1B, Q2B. This reduces parasitic inductance loops and, thus, ringing at the switching nodes SWA, SWB. As illustrated, the input capacitors C1A, C1B each have both of their terminals on the same side so as to reduce parasitic loops. These capacitors C1A, C1B may be implemented, e.g., as silicon trench capacitors or ceramic capacitors.

The phase A switching node SWA connects to the phase A winding LA of the coupled inductor 420 at a first side of the coupled inductor. The other end of the winding LA is located on an opposing side of the coupled inductor at a phase A output voltage node VOUT_A. The phase A current IA flows from the switching node SWA, through the winding LA, and to the output voltage node VOUT_A. The components of phase B are analogously configured, but arranged in a mirror image to the corresponding phase A components. The phase B current IB flows from the switching node SWB, through the winding LB, and to the output voltage node VOUT_B. The windings LA, LB are wound around a common core 422, which is typically a magnetic core. By using a common core for both windings LA, LB, the volume required by the coupled inductor 420 is reduced relative to other inductors, e.g., two inductors with distinct and separate cores. The output voltage connections VOUT_A, VOUT_B of the coupled inductor 420 are merged on the top level (surface) 414 of the voltage converter inlay 410 to form the output terminal 402, which provides the relatively low DC output voltage VOUT to the microprocessor die 460. The output voltage VOUT and the power ground PGND may be vertically routed to the microprocessor 460, which is placed directly above the voltage converter inlay 410.

The output capacitance is preferably also integrated within the voltage converter inlay 410. As shown in FIG. 5A, the output capacitors C2A, C2B are located adjacent, respectively, to the phase A and B output voltage nodes VOUT_A, VOUT_B. Such integration and positioning of the output capacitors C2A, C2B reduces EMI and output voltage ripple. The illustrated output capacitors C2A, C2B each have terminals on opposite sides, and could be realized as silicon trench or ceramic capacitors within the substrate of the voltage converter inlay 410.

Figure 5B:
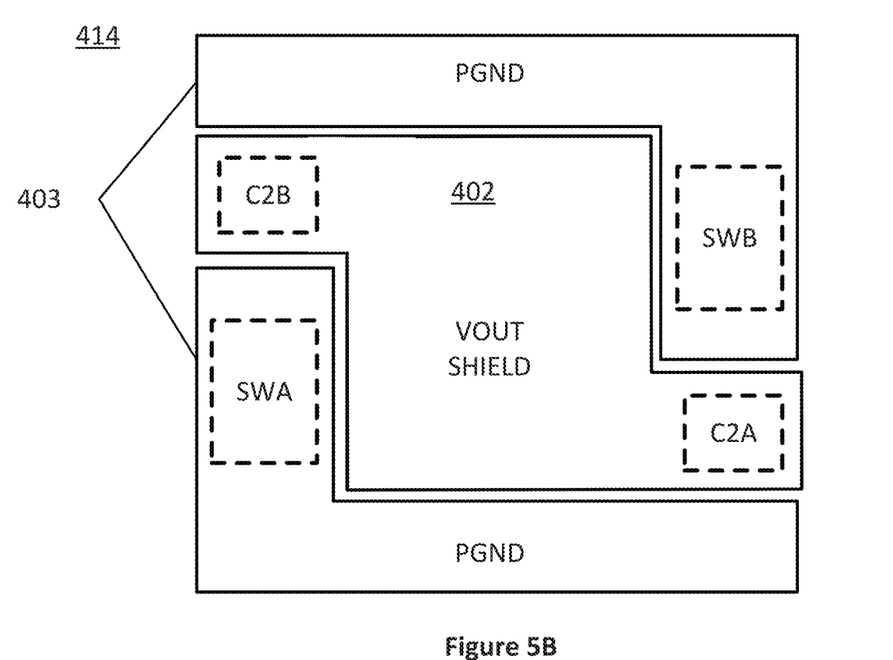

FIG. 5B illustrates a plan view of the top surface 414 of the voltage converter inlay 410. The top surface 414 includes a metallization for the output terminal 402 and a metallization 403 for the power ground PGND. These metallizations 402, 403 are configured for connection to the microprocessor 160, e.g., using vias within the package substrate 490 (not shown for ease of illustration). For ease of reference, the switching nodes SWA, SWB and output capacitors C2A, C2B are shown in dotted boxes, but should be understood to be located on a lower layer of the voltage converter substrate 450, and to connect through to the top surface 414 using, e.g., vias as shown in the cross-sectional view of FIG. 5A. The metallizations 402, 403 cover substantially all of the coupled inductor 420, the switching nodes SWA, SWB, and the output voltage connections VOUT_A, VOUT_B, which connect to the output capacitors C2A, C2B. Hence, these metallizations 402, 403 form a shield between the high-frequency and high-current signals of the voltage converter inlay 410 and other parts of the system.

Figure 5C:
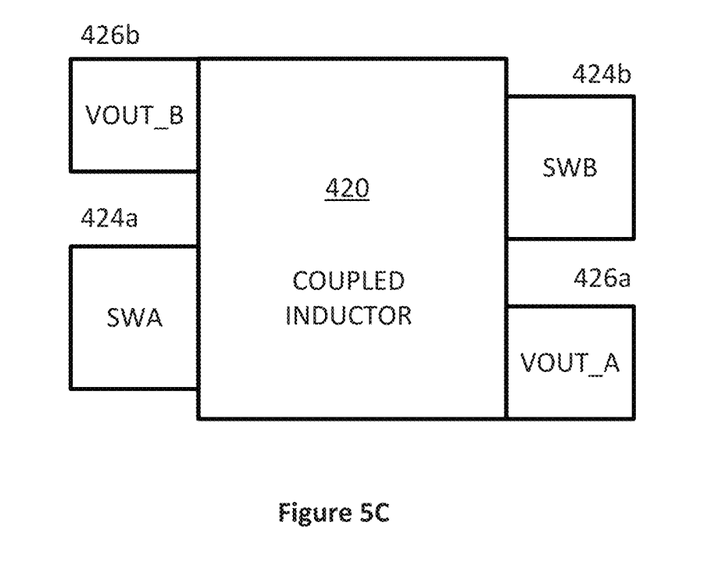

FIG. 5C illustrates a cross-sectional view of the coupled inductor 420, including metallizations (e.g., tabs), 424a, 426a, 424b, 426b for its terminals. The coupled inductor 420 is placed within a cavity of the substrate 450, wherein the cavity cuts through interconnect layer 416 of the voltage converter inlay 410. The phase A switching node SWA (terminal 424a) connects to the first winding LA of the coupled inductor 420, such that current flows from the switching node SWA to the phase A output voltage connection VOUT_A (terminal 426a). Likewise, the phase B switching node SWB connects to the second winding LB of the coupled inductor 420 such that current flows from the switching node SWB (terminal 424b) to the phase B output voltage connection VOUT_B (terminal 426b).

Figure 5D:
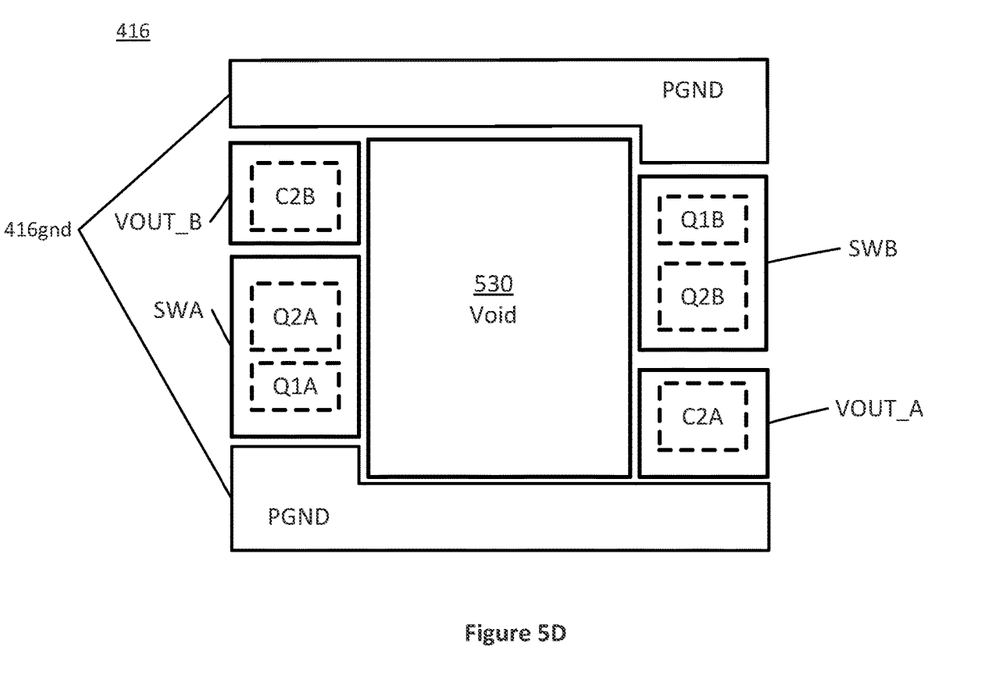

FIG. 5D illustrates a view through the interconnect layer 416, and shows connections outside of the coupled inductor 420. This layer 416 includes a metallization corresponding to the phase A switch node SWA, which is electrically connected to the source of the high-side switch Q1A, the drain of the low-side switch Q2A and the input terminal 424a of the first winding LA. Also included is a similar metallization for the phase B switch node SWB, which is electrically connected to the source of the high-side switch Q1B, the drain of the low-side switch Q2B and the input terminal 424b of the second winding LB. For ease of reference, the switches Q1A, Q2A, Q1B, Q2B are shown in dotted boxes, but should be understood to be located just below the interconnect layer 416, as shown in FIG. 5A. In one embodiment, a cavity 530 is formed in the inlay substrate 450 and extends through the interconnect layer 416. The cavity 530 is configured to accept the coupled inductor 420. When fabricating the layers of the voltage converter inlay 410, the coupled inductor 420 may be placed in the cavity 530 before the top surface and the interconnect layer 418 are formed. Leads 424a, 426a, 424b, 426b corresponding to the windings LA, LB of the inductor 420 are coupled to the switch nodes SWA, SWB and the output voltage connections VOUT_A, VOUT_B. Alternatively, the coupled inductor 420 may be fabricated directly within the inlay substrate 450.

Figure 5E:
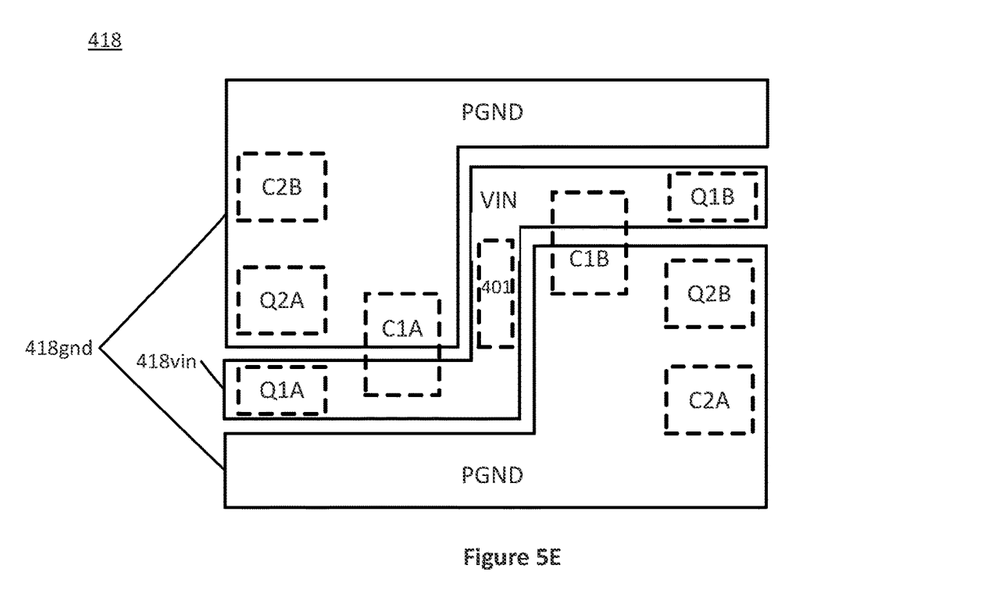

FIG. 5E illustrates a cross-sectional view of the interconnect layer 418. A VIN metallization 418vin forms an S shape through the layer 418, wherein the center portion of this metallization 418vin is connected, e.g., using a via as shown in FIG. 5A, to the input terminal 401 of the bottom surface 412. The metallization 418vin connects to the drains of the high-side switches Q1A, Q1B. The remaining area of the interconnect layer 418 includes ground metallizations 418gnd. These metallizations 418gnd connect to sources of the low-side switches Q2A, Q2B. Input capacitors C1A, C2A are coupled across the input voltage metallization 418vin and ground metallizations 418gnd just below the interconnect layer 418. The ground metallizations 418gnd connect, e.g., using vias, to the output capacitors C2A, C2B. As indicated by the dashed boxes, the switches Q1A, Q2A, Q1B, Q2B and output capacitors C2A, C2B are not located within the interconnect layer 418, but are instead located above it. Likewise, the input capacitors C1A, C1B and the input voltage terminal 401 are not located within the interconnect layer 418, but are instead located below it.

Although the present disclosure is not so limited, the following numbered examples demonstrate one or more aspects of the disclosure.

Example 1. A switching voltage converter module is configured to conduct current in a vertical direction. The module comprises a substrate, an input terminal, an output terminal, one or more power switches, and an inductor. The substrate has first and second main surfaces that are opposite each other. The input terminal is located at the first main surface and is configured for connection to a load. The output terminal is located at the second main surface and is configured for connection to a power sink. The one or more power switches and the inductor are embedded in the substrate between the first and second main surfaces, and the inductor is coupled to the one or more power switches.

Example 2. The switching voltage converter module of example 1, wherein the inductor comprises a coupled inductor that includes first and second windings. The first winding is wound on a common core and has a first inductor input, which is coupled to a first switch node, and a first inductor output. The second winding is also wound on the common core and has a second inductor input, which is coupled to a second switch node, and a second inductor output.

Example 3. The switching voltage converter module of example 2, comprising first and second phases. The first phase includes the first winding, a first power switch coupled between the input terminal and the first switch node, and a second power switch coupled between the first switch node and a reference. The second phase includes the second winding, a third power switch coupled between the input terminal and the second switch node, and a fourth power switch coupled between the second switch node and the reference. The one or more power switches include the first, the second, the third and the fourth power switches.

Example 4. The switching voltage converter of example 3, wherein each of the first and second phases is a buck converter configured to convert an input voltage at the input terminal into an output voltage at the output terminal The first and second inductor outputs are coupled to the output terminal.

Example 5. The switching voltage converter module of example 1, wherein the output terminal or a combination of a metallization of the output terminal and metallization of one or more reference terminals comprises a metal shield that entirely covers a core of the inductor.

Example 6. The switching voltage converter module of example 5, wherein the one or more power switches and the switch nodes coupled to the one or more power switches are covered by a metallization of the output terminal or by a combination of a metallization of the output terminal and metallizations of one or more reference terminals.

Example 7. The switching voltage converter module of example 6, wherein the output terminal comprises an interior portion of the second main surface, and an exterior portion of the second main surface comprises the one or more reference terminals.

Example 8. The switching voltage converter module of example 7, wherein the one or more reference terminals of the second main surface comprises a contiguous metallization that surrounds a metallization of the output terminal.

Example 9. The switching voltage converter module of example 1, wherein the inductor is placed within a cavity of the switching voltage converter module.

Example 10. The switching voltage converter module of example 1, wherein the one or more power switches are vertical power metal-oxide semiconductor field-effect transistors (MOSFETs).

Example 11. The switching voltage converter module of example 1, wherein at least two of the one or more power switches are monolithically integrated in a same semiconductor die.

Example 12. The switching voltage converter module of example 1, wherein at least a first of the one or more power switches and a first switch driver configured for driving the first power switch are monolithically integrated in a same semiconductor die.

Example 13. The switching voltage converter module of example 1, further comprising an input and an output capacitor. The input capacitor is coupled between the input terminal and a reference, and is embedded in the substrate between the first and second main surfaces. The output capacitor is coupled between the output terminal and the reference, and is embedded in the substrate between the first and second main surfaces.

Example 14. The switching voltage converter module of example 13, wherein the output capacitor is a vertical capacitor having a first terminal proximate the first horizontal surface, and a second terminal proximate the second horizontal surface.

Example 15. The switching voltage converter module of example 13, wherein the input capacitor and the output capacitor are silicon capacitors.

Example 16. The switching voltage converter module of example 13, wherein the input capacitor is a silicon capacitor that is monolithically integrated in a same die as at least one of the one or more power switches.

Example 17. The switching voltage converter module of example 16, wherein the output capacitor is a silicon capacitor that is monolithically integrated with the same die.

Example 18. A processor system comprises a processor substrate, a processor attached to the processor substrate, and a switching voltage converter module arranged within the processor substrate. The switching voltage converter module includes a converter substrate, a converter input terminal, a converter output terminal, one or more power switches, and an inductor. The converter substrate has first and second main surfaces that are opposite each other. The converter input terminal is located at the first main surface and is configured for connection to a power source. The converter output terminal is located at the second main surface and is connected to an input power terminal of the processor substrate. The one or more power switches and the inductor are embedded in the converter substrate between the first and second main surfaces, and the inductor is coupled to the one or more power switches.

Example 19. A circuit board system comprises a circuit board having a first surface, a power source, and a processor system. The processor system includes a processor substrate that is electrically connected to the first surface, a processor attached to the processor substrate, and a switching voltage converter module arranged within the processor substrate. The switching voltage converter module comprises a converter substrate, a converter input terminal, a converter output terminal, one or more power switches, and an inductor. The converter substrate has first and second main surfaces that are opposite each other. The converter input terminal is located at the first main surface and is configured for connection to the power source via a power terminal of the circuit board. The converter output terminal is located at the second main surface and is connected to an input power terminal of the processor substrate. The one or more power switches and the inductor are embedded in the converter substrate between the first and second main surfaces, and the inductor is coupled to the one or more power switches.

Example 20. The circuit board system of example 19, further including a socket that is attached to the first surface and is configured to provided electrical connection to the processor substrate of the processor system.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switching voltage converter module configured to conduct current in a vertical direction, comprising:
   a substrate having a first main surface and a second main surface that is opposite the first main surface;
   an input terminal at the first main surface and configured for connection to a power source;
   an output terminal at the second main surface and configured for connection to a load;
   one or more power switches embedded in the substrate between the first and second main surfaces; and
   an inductor embedded in the substrate and coupled to the one or more power switches,
   wherein the one or more power switches and switch nodes coupled to the one or more power switches are covered by a metallization of the output terminal or by a combination of the metallization of the output terminal and a metallization of one or more reference terminals.

2. The switching voltage converter module of claim 1, wherein the inductor comprises a coupled inductor that includes:
   a first winding on a common core and having a first inductor input, which is coupled to a first switch node, and a first inductor output; and
   a second winding on the common core and having a second inductor input, which is coupled to a second switch node, and a second inductor output.

3. The switching voltage converter module of claim 2, further comprising:
   a first phase including the first winding, a first power switch coupled between the input terminal and the first switch node, and a second power switch coupled between the first switch node and a reference; and
   a second phase including the second winding, a third power switch coupled between the input terminal and the second switch node, and a fourth power switch coupled between the second switch node and the reference,
   wherein the one or more power switches include the first, the second, the third and the fourth power switches.

4. The switching voltage converter of claim 3, wherein each of the first and second phases is a buck converter configured to convert an input voltage at the input terminal to an output voltage at the output terminal, and wherein the first and second inductor outputs are coupled to the output terminal.

5. The switching voltage converter module of claim 1, wherein the output terminal comprises an interior portion of the second main surface, and an exterior portion of the second main surface comprises the one or more reference terminals.

6. The switching voltage converter module of claim 5, wherein the one or more reference terminals of the second main surface comprises a contiguous metallization that surrounds the metallization of the output terminal.

7. The switching voltage converter module of claim 1, wherein the inductor is placed within a cavity of the switching voltage converter module.

8. The switching voltage converter module of claim 1, wherein the one or more power switches are vertical power metal-oxide semiconductor field-effect transistors (MOSFETs).

9. The switching voltage converter module of claim 1, wherein at least two of the one or more power switches are monolithically integrated in a same semiconductor die.

10. The switching voltage converter module of claim 1, wherein at least a first one of the one or more power switches and a first switch driver configured for driving the first power switch are monolithically integrated in a same semiconductor die.

11. The switching voltage converter module of claim 1, further comprising:

an input capacitor coupled between the input terminal and a reference, and embedded in the substrate between the first and second main surfaces.

12. The switching voltage converter module of claim 11, further comprising:
an output capacitor coupled between the output terminal and the reference, and embedded in the substrate between the first and second main surfaces.

13. The switching voltage converter module of claim 12, wherein the output capacitor is a vertical capacitor having a first terminal proximate the first main surface, and a second terminal proximate the second main surface.

14. The switching voltage converter module of claim 12, wherein the input capacitor and the output capacitor are both silicon capacitors.

15. The switching voltage converter module of claim 12, wherein the input capacitor is a silicon capacitor that is monolithically integrated in a same die as at least one of the one or more power switches.

16. The switching voltage converter module of claim 15, wherein the output capacitor is a silicon capacitor that is monolithically integrated with the same die.

17. A processor system comprising:
a processor substrate;
a processor attached to the processor substrate; and
a switching voltage converter module comprising:
a converter substrate having a first main surface and a second main surface that is opposite the first main surface;
a converter input terminal at the first main surface and configured for connection to a power source;
a converter output terminal at the second main surface and connected to an input power terminal of the processor substrate;
one or more power switches embedded in the converter substrate between the first and second main surfaces; and
an inductor embedded in the converter substrate and coupled to the one or more power switches,
wherein the one or more power switches and switch nodes coupled to the one or more power switches are covered by a metallization of the converter output terminal or by a combination of the metallization of the converter output terminal and a metallization of one or more reference terminals.

18. The processor system of claim 17, wherein the switching voltage converter module further comprises an input capacitor coupled between the input terminal and a reference, and embedded in the substrate between the first and second main surfaces.

19. A circuit board system comprising:
a circuit board having a first surface;
a power source; and
a processor system comprising:
a processor substrate electrically connected to the first surface;
a processor attached to the processor substrate; and
a switching voltage converter module comprising:
a converter substrate having a first main surface and a second main surface that is opposite the first main surface;
a converter input terminal at the first main surface and configured for connection to the power source via a power terminal of the circuit board;
a converter output terminal at the second main surface and connected to an input power terminal of the processor substrate;
one or more power switches embedded in the converter substrate between the first and second main surfaces; and
an inductor embedded in the converter substrate and coupled to the one or more power switches,
wherein the one or more power switches and switch nodes coupled to the one or more power switches are covered by a metallization of the converter output terminal or by a combination of the metallization of the converter output terminal and a metallization of one or more reference terminals.

20. The circuit board system of claim 19, further comprising:
a socket attached to the first surface and configured to provide electrical connection to the processor substrate of the processor system.

* * * * *